United States Patent
Paik et al.

(10) Patent No.: US 11,627,276 B2
(45) Date of Patent: Apr. 11, 2023

(54) A/D CONVERTER INCLUDING COMPARISON CIRCUIT AND IMAGE SENSOR INCLUDING SAME

(71) Applicant: SAMSUNG ELECTRONICS CO., LTD., Suwon-si (KR)

(72) Inventors: Daehwa Paik, Seoul (KR); Jaehong Kim, Suwon-si (KR); Jinwoo Kim, Seoul (KR); Seunghyun Lim, Hwaseong-si (KR); Sanghyun Cho, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/470,187

(22) Filed: Sep. 9, 2021

(65) Prior Publication Data

US 2022/0116564 A1  Apr. 14, 2022

(30) Foreign Application Priority Data

Oct. 8, 2020 (KR) .......................... 10-2020-0130443

(51) Int. Cl.
| | |
|---|---|
| H04N 5/378 | (2011.01) |
| H04N 5/369 | (2011.01) |
| H04N 5/363 | (2011.01) |
| H04N 5/376 | (2011.01) |
| H03M 1/56 | (2006.01) |

(52) U.S. Cl.
CPC .............. *H04N 5/378* (2013.01); *H03M 1/56* (2013.01); *H04N 5/363* (2013.01); *H04N 5/3698* (2013.01); *H04N 5/3765* (2013.01)

(58) Field of Classification Search
CPC .. H04N 5/363; H04N 5/37455; H04N 5/3765; H04N 5/378
See application file for complete search history.

(56) References Cited

U.S. PATENT DOCUMENTS

| | | | |
|---|---|---|---|
| 6,906,749 B1 | 6/2005 | Fox | |
| 7,463,013 B2 | 12/2008 | Plojhar | |
| 8,749,424 B2 | 6/2014 | Ueno | |
| 8,773,191 B2 | 7/2014 | Park et al. | |
| 9,282,264 B2 | 3/2016 | Park et al. | |
| 9,660,590 B2 | 5/2017 | Kim et al. | |
| 2004/0056716 A1 | 3/2004 | Wey et al. | |
| 2017/0060157 A1 | 3/2017 | Jefremow et al. | |
| 2022/0201231 A1* | 6/2022 | Ebihara | H03K 5/24 |

* cited by examiner

*Primary Examiner* — Daniel M Pasiewicz
(74) *Attorney, Agent, or Firm* — F. Chau & Associates, LLC

(57) ABSTRACT

An A/D converter and an image sensor are disclosed. The image sensor includes: a pixel array including a plurality of pixels; a ramp signal generator configured to generate a ramp signal; and a comparison circuit configured to output a comparison result signal by comparing a pixel signal output by the pixel array with the ramp signal. The comparison circuit includes: a first comparator stage configured to output a first stage output signal according to a result of comparing the pixel signal with the ramp signal, to a first circuit node; a limiter including an n-type transistor having one end connected to the first circuit node and an opposite end to which power supply voltage is applied; and a second comparator stage configured to generate the comparison result signal by shaping the first stage output signal.

20 Claims, 14 Drawing Sheets

A/D CONVERTER INCLUDING COMPARISON CIRCUIT AND IMAGE SENSOR INCLUDING SAME

CROSS-REFERENCE TO RELATED APPLICATION

This application is based on and claims priority under 35 U.S.C. § 119 to Korean Patent Application No. 10-2020-0130443, filed on Oct. 8, 2020 in the Korean Intellectual Property Office, the disclosure of which is incorporated by reference herein in its entirety.

TECHNICAL FIELD

This disclosure relates generally to image sensors, and more particularly, to an analog-to-digital (A/D) converter including a comparison circuit, and an image sensor including the A/D converter.

DISCUSSION OF RELATED ART

An image sensor is a device that captures a two-dimensional or three-dimensional image of a scene. An image sensor generates an image of the scene by using a photoelectric conversion element that reacts according to the intensity of light emanating from objects in the scene. Today, complementary metal-oxide semiconductor (CMOS) image sensors utilizing CMOS transistors are widely used. In a CMOS image sensor, correlated double sampling (CDS) technology is used to remove noise present within a pixel. The noise may be sampled after a reset period, and the noise sample is subtracted from a signal sample taken shortly before or after the noise sample to remove the noise. To improve image quality, high performance of an A/D converter using CDS technology is desirable.

SUMMARY

Embodiments of the inventive concept provide an A/D converter including a comparison circuit having reduced noise and reduced power consumption, and an image sensor including the same.

According to an aspect of the inventive concept, there is provided an image sensor including: a pixel array including a plurality of pixels; a ramp signal generator configured to generate a ramp signal; and a comparison circuit configured to output a comparison result signal by comparing a pixel signal output by the pixel array with the ramp signal, wherein the comparison circuit includes: a first comparator stage configured to output a first stage output signal according to a result of comparing the pixel signal with the ramp signal, to a first circuit node; a limiter including an n-type transistor having one end connected to the first circuit node and having an opposite end to which a power supply voltage is applied; and a second comparator stage configured to generate the comparison result signal by shaping the first stage output signal.

In another aspect, an A/D converter in which a pixel signal output from a pixel array is converted to a digital signal according to the inventive concept includes: a first comparator stage configured to output a first stage output signal according to a result of comparing the pixel signal with the ramp signal, to a first circuit node; a limiter configured to limit a voltage level of the first stage output signal by providing current to the first circuit node; and a second comparator stage configured to generate a comparison result signal based on the first stage output signal, where the limiter includes an n-type transistor having one end connected to the first circuit node and an opposite end to which a power supply voltage is applied.

In another aspect, an A/D converter in which a pixel signal output from a pixel array is converted to a digital signal according to the inventive concept includes: a comparison circuit configured to output a comparison result signal by comparing the pixel signal with a ramp signal; and a counter configured to generate the digital signal by determining a count at a logic level transition time of the comparison result signal using a counting clock signal The comparison circuit includes: a first comparator stage configured to output a first stage output signal according to a result of comparing the pixel signal with the ramp signal, to a first circuit node; a limiter including an n-type transistor having one end connected to the first circuit node, with a power supply voltage being applied to an opposite end; and a second comparator stage configured to generate the comparison result signal by shaping the first stage output signal.

In another aspect, an A/D converter as summarized above converts another type of analog signal (other than a pixel signal) to a digital signal in an analogous manner.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, embodiments of the inventive concept are described in detail with reference to the accompanying drawings.

Herein, when an element or signal is first introduced with a name followed by a legend, for brevity, the element/signal may be subsequently referred to using just the legend. For example, "the first stage output signal OS1P" may subsequently be referred to as just "OS1P"; "the second n-type transistor MN12" may later be called just "MN12"; "the power supply voltage VDD" may be later called "VDD"; "the time point T1" may be later referred to as "T1"; etc.

Herein, an "end" of a field effect transistor (FET) is a source or a drain of the FET, and the other end is the other of the source or the drain of the FET.

Herein, a "signal" present at a circuit node or an output terminal may be a time varying voltage, unless described in the context of a current.

Figure 1:
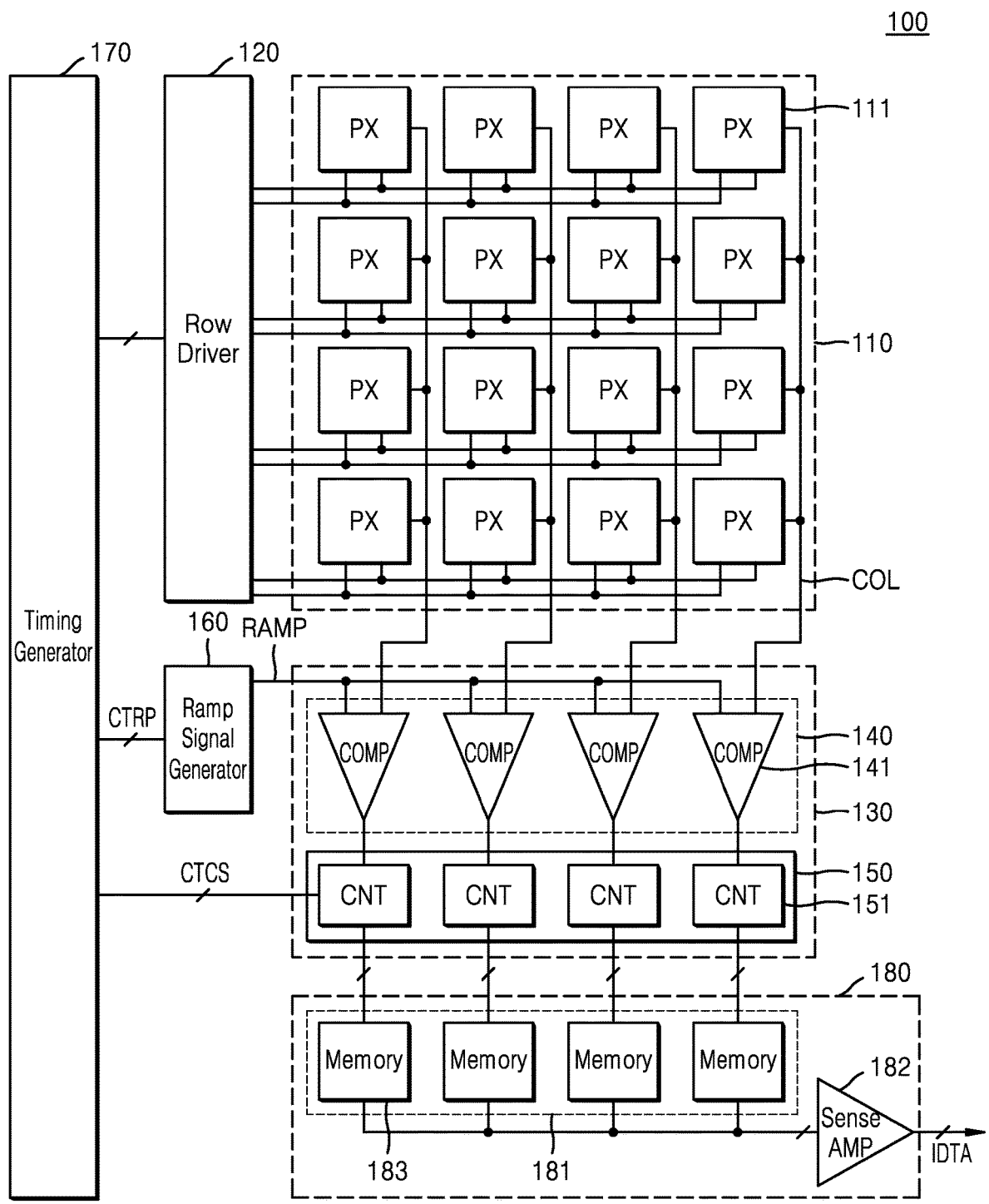
FIG. 1 is a diagram of an image sensor according to an example embodiment.

FIG. 1 is a diagram of an image sensor, 100, according to an example embodiment. The image sensor 100 may be mounted on an electronic device having an image or light sensing function. For example, the image sensor 100 may be mounted on an electronic device such as a camera, a smartphone, a wearable device, an Internet of Things (IoT) device, a personal computer (PC), a personal digital assistant (PDA), a portable multimedia player (PMP), and a navigation device. In other examples, the image sensor 100 may be mounted on an electronic device to be provided as a component of vehicles, furniture, manufacturing equipment, doors, various measuring devices, etc.

The image sensor 100 may include a pixel array 110, a row driver 120, an analog-to-digital converter (ADC) 130, a ramp signal generator 160, a timing generator 170, and a buffer 180.

The pixel array 110 may include a plurality of pixels 111 that are respectively connected to a plurality of row lines and a plurality of column lines COL, and arranged in a matrix form. Each of the plurality of pixels 111 may include a photo-sensing element. For example, the photo-sensing element may include a photodiode, a photo transistor, a port gate, a pinned photodiode, etc. Each of the plurality of pixels 111 may include at least one photo-sensing element, and in an embodiment, each of the plurality of pixels 111 may include a plurality of photo-sensing elements. The plurality of photo-sensing elements may be stacked on each other.

The plurality of pixels 111 may sense light by using the photo-sensing element and convert the sensed light into a pixel signal (PXS in FIG. 2), which is an electrical signal. Each of the plurality of pixels 111 may detect light in a certain spectral range. For example, the plurality of pixels 111 may include red pixels converting light in a red spectral range into an electric signal, green pixels converting light in a green spectral range into an electric signal, and blue pixels converting light in a blue spectrum region into an electric signal. A color filter for transmitting light in a certain spectral range may be arranged on each of the plurality of pixels 111.

The pixel signal PXS may include a reset signal generated according to a reset operation of each of the plurality of pixels 111, and may include an image signal according to a light sensing operation of each of the plurality of pixels 111.

The timing generator 170 may output a control signal or a clock signal to each of the row driver 120, the ADC 130, and the ramp signal generator 160, and may control operations or timings of the row driver 120, the ADC 130, and the ramp signal generator 160.

The row driver 120 may drive the pixel array 110 in units of rows. The row driver 120 may decode a row control signal (for example, an address signal) generated by the timing generator 170, and in response to the decoded row control signal, may select at least one row line of the row lines constituting the pixel array 110. For example, the row driver 120 may generate a row select signal. The pixel array 110 may output the pixel signal PXS from a row selected by the row select signal provided by the row driver 120.

The ADC 130 may convert a pixel signal, which is an analog signal input by the pixel array 110, into a digital signal. The ADC 130 may include a comparison block 140 and a counter block 150.

The comparison block 140 may compare a pixel signal output by a unit pixel connected to any one of the column lines COL constituting the pixel array 110 with a ramp signal RAMP. The comparison block 140 may include a plurality of comparison circuits 141, and each of the plurality of comparison circuits 141 may be connected to at least one corresponding column line COL of the plurality of column lines COL. Each of the plurality of comparison circuits 141 may be connected to generator 160.

Each of the plurality of comparison circuits 141 may receive a pixel signal generated by the pixel array 110 and the ramp signal RAMP generated by the ramp signal generator 160, compare them to each other, and output a comparison result signal.

Each of the plurality of comparison circuits 141 may generate the comparison result signal to which a correlated double sampling technique is applied, and may be referred to as a correlated double sampling circuit. The pixel signals output by the plurality of pixels 111 may have deviations due to pixel-unique characteristics (for example, fixed pattern noise (FPN), etc.) of each pixel and/or deviations due to characteristic difference of a logic to output a pixel signal from the pixel 111. To compensate for the deviations between the pixel signals, obtaining a reset component (or a reset signal) and an image component (or an image signal) for each of the pixel signals, and extracting the difference between them as an effective signal component may be referred to as a correlated double sampling. Each of the plurality of comparison circuits 141 may output a comparison result signal to which the correlated double sampling technique has been applied.

Each of the plurality of comparison circuits 141 may include a first comparator stage comparing the pixel signal to the ramp signal, and a second comparator stage that shapes an output signal of the first comparator stage (e.g., amplifying, sharpening transitions, and flattening waveforms), and may include a limiter (for example, LT in FIG. 2) connected to a circuit node (e.g., a first circuit node OP in FIG. 2) of the first comparator stage. The limiter LT may limit an output voltage at the circuit node OP so that it does not fall below a certain level. Such limiting may be accomplished by allowing the current to flow when the output voltage at the circuit node OP falls below a certain level. Accordingly, reduction of a drain/source voltage of a transistor to which the pixel signal is input in the first comparator stage may be prevented, and column fixed pattern noise (CFPN) associated with a random telegraph signal (RTS) (also known as burst noise) that is generated due to a trap charge may be prevented.

The ramp signal generator 160 may generate the ramp signal RAMP. The ramp signal generator 160 may operate based on the ramp control signal CTRP provided by the timing generator 170. The ramp control signal CTRP may include a ramp enable signal, a mode signal, or the like. When the ramp enable signal is activated, the ramp signal generator 160 may generate RAMP having a slope set based on the mode signal. For example, the ramp signal generator 160 may generate RAMP that decreases at a constant slope, or may generate a reverse ramp signal RAMP that increases at a constant slope.

The counter block 150 may include a plurality of counters 151. The plurality of counters 151 may be respectively connected to output terminals of the plurality of comparison circuits 141, and may count based on respective output signals of the plurality of comparison circuits 141. A counter control signal CTCS may include a counter clock signal, a counter reset signal for controlling a reset operation of each of the plurality of counters 151, and an inverting signal for inverting an internal bit of each of the plurality of counters 151. The counter block 150 may "count each comparison result signal" by using the counter clock signal, and output the counted comparison result signals as respective digital signals. In other words, for each comparison result signal, the counter block 150 may determine a count (referenced to a count start time) at a logic level transition time of the comparison result signal, by comparing a pixel signal with a ramp signal (explained in detail below). The count may be the digital signal representing the analog pixel voltage.

Each of the plurality of counters 151 may include an up/down counter and a bit-wise inversion counter. The bit-wise inversion counter may perform an operation similar to that of the up/down counter. For example, the bit-wise inversion counter may perform only an up-counting, and invert all bits therein into 1's complements when a particular signal is input. The bit-wise counter may perform a reset count, and then invert a result thereof into its complement, that is, a negative value of the result thereof.

The image sensor 100 may further include a counting code generator that performs counting code under the control of the timing generator 170. The counting code generator may be implemented as a gray code generator, and may generate a plurality of code values having a resolution according to a certain number of bits as a result of the counting code. For example, each of the plurality of counters 151 may include a latch circuit and an operation circuit, and the latch circuit may receive the counting code from the counting code generator and the output signal from the comparison block 140, and may latch a code value of the counting code at a time point at which a level of the comparison signal transitions. The operation circuit may calculate a reset value and an image signal value, and generate an image signal value in which a reset level of the pixel 111 has been removed. The counter block 150 may output the image signal value in which the reset level has been removed as the pixel value.

The buffer 180 may temporarily store, sense, amplify, and output the digital signal output by the ADC 130. The buffer 180 may include a column memory block 181 and a sense amplifier (AMP) 182. The column memory block 181 may include a plurality of memories 183. The plurality of memories 183 may temporarily store the digital signal output by the plurality of counters 151, respectively, and then output the stored digital signal to the sense AMP 182. The sense AMP 182 may sense and amplify the digital signals output by the plurality of memories 183. The sense AMP 182 may sequentially output the amplified digital signals as image data IDTA.

Figure 2:
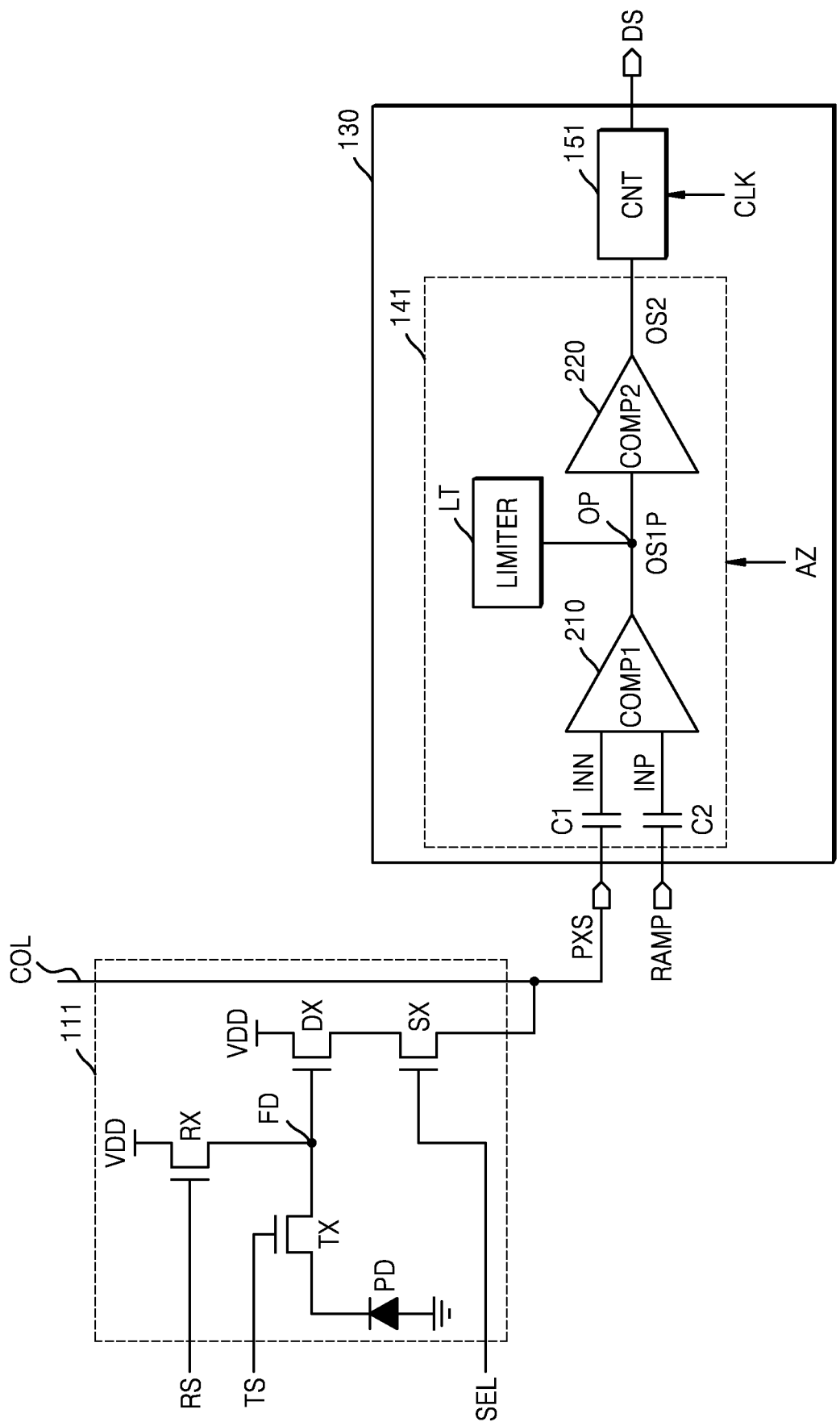
FIG. 2 is a diagram of a pixel included in an image sensor and an analog-to-digital converter (ADC) connected to the pixel, according to an embodiment.

FIG. 2 is a diagram of an example pixel 111 included in an image sensor and the ADC 130 connected to the pixel, according to an embodiment. The pixel 111 may include a photodiode PD, a transfer transistor TX, a floating diffusion node FD, a reset transistor RX, a drive transistor DX, and a select transistor SX. Note that the photodiode PD may be substituted with another type of photoelectric conversion element.

The photodiode PD may generate photocharges that vary according to the intensity of incident light. The transfer transistor TX may transmit the photocharges to the floating diffusion node FD according to a transmission control signal TS output by the row driver (120 in FIG. 1). The drive transistor DX may amplify and transmit the photo charges to the select transistor SX according to the potential according to the photocharges accumulated in the floating diffusion node FD. A drain of the select transistor SX may be connected to a source of the drive transistor DX, and accordingly, the pixel signal PXS may be output to the column line COL connected to the pixel 111 according to the select signal SEL output by the row driver 120. The reset transistor RX may reset the floating diffusion node FD to a level of a power supply voltage VDD according to a reset control signal RS provided by the row driver 120.

In FIG. 2, the pixel 111 is illustrated as having a 4-transistor (4T) structure including one photodiode PD and four transistors, that is, the transfer transistor TX, the reset transistor RX, the drive transistor DX, and the select transistor SX, but each of the plurality of pixels 111 included in the image sensor according to an embodiment is not limited to the structure in FIG. 2. The pixel 111 may include a pixel of a 3-transistor (3T) structure, may include the photodiode PD, and may also include three transistors among the transfer transistor TX, the reset transistor RX, the drive transistor DX, and the select transistor SX.

The ADC 130 may include the comparison circuit 141 and the counter 151. For clarity of explanation, one comparison circuit 141 and one counter 151 connected to one column line COL are illustrated, but as described with reference to FIG. 1, the ADC 130 may include the plurality of comparison circuits 141 and the plurality of counters 151 connected to the plurality of column lines COL.

The comparison circuit 141 may include a first comparator stage 210, a second comparator stage 220, the limiter LT, and capacitors C1 and C2. The first comparator stage 210 may include a differential amplifier, which may in turn include an operational transconductance amplifier (OTA), an operation amplifier, etc.

The ramp signal RAMP may be received as a first input signal INP at a first input terminal of the first comparator stage 210, and the pixel signal PXS may be received at a second input terminal as a second input signal INN. The first comparator stage 210 may compare the pixel signal PXS and the ramp signal RAMP received via the capacitors C1 and C2, respectively and output a comparison result to OP as a first stage output signal OS1P.

The limiter LT may be connected to the first circuit node OP of the first comparator stage 210, and may limit a voltage at the first circuit node OP, that is, a level of the output signal OS1P. The limiter LT may limit the level of OS1P so that it is not reduced to a voltage level lower than a particular level, by providing current to OP.

The second comparator stage 220 may shape, amplify and/or invert the output signal OS1P output by the first comparator stage 210. For example, the second comparator stage 220 may be implemented as an amplifier, and for example, may include a differential amplifier, an inverter, etc. The output signal OS2 output by the second comparator stage 220 may include a comparison result signal that is provided to the counter 151.

The comparison circuit 141 may be initialized in response to an auto-zero signal AZ during an auto-zero period before a comparison operation is performed. For example, AZ may include a first auto-zero signal (AZ1 in FIG. 3) input to the first comparator stage 210 and a second auto-zero signal (AZ2 in FIG. 3) input to the second comparator stage 220.

The counter 151 may output the digital signal DS by counting the comparison result signal, that is, OS2 of the second comparator stage 220, based on a counting clock signal CLK. The counter 151 may transmit the digital signal DS to a buffer (180 in FIG. 1).

Figure 3:
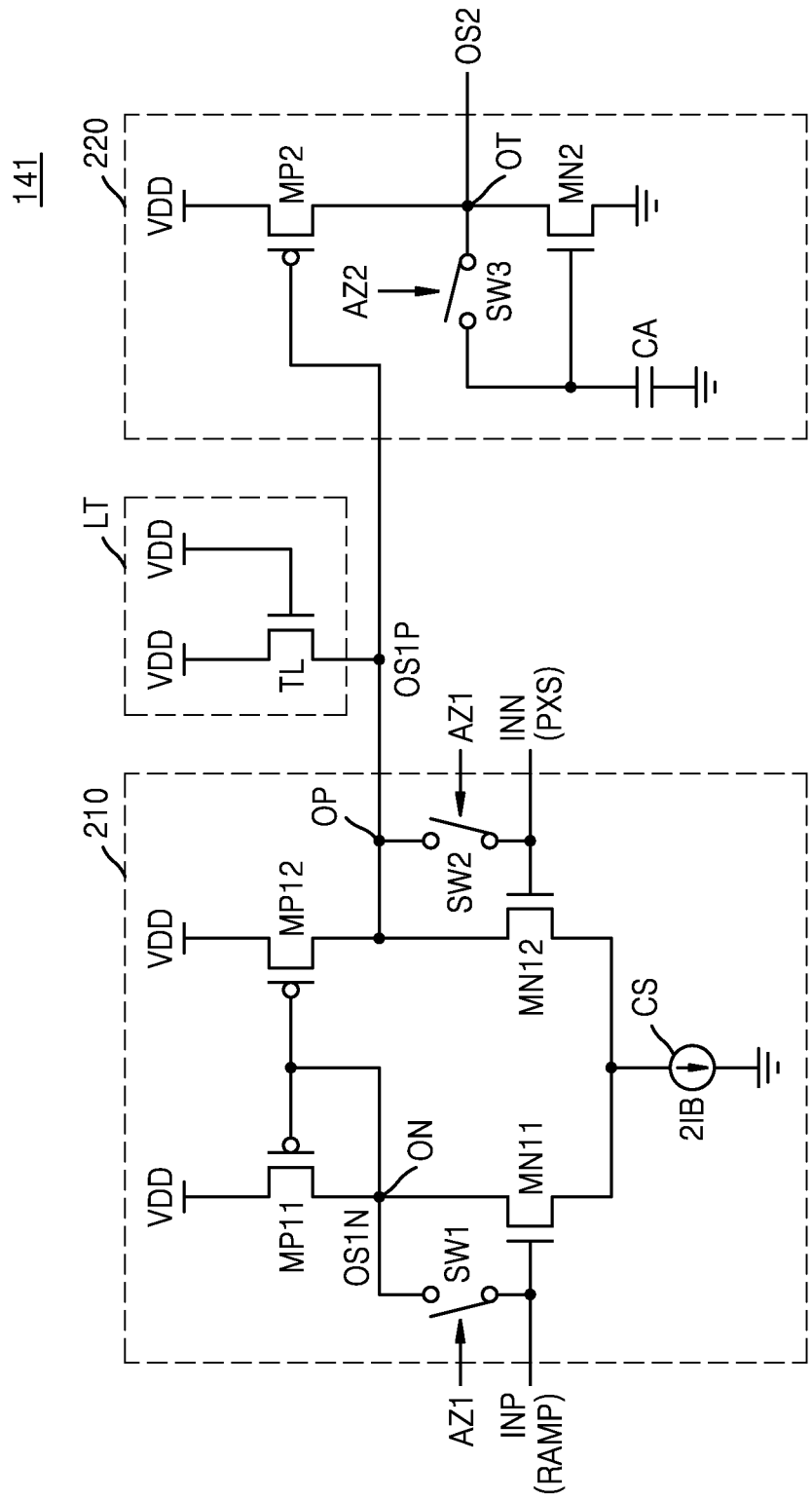
FIG. 3 is an example circuit diagram of a comparison circuit included in the ADC, according to an embodiment.

FIG. 3 is an example circuit diagram of a comparison circuit included in the ADC 130, according to an embodiment. The first output signal OS1P illustrated in FIG. 3 may be OS1P in FIG. 2.

Referring to FIG. 3, the first comparator stage 210 may include a first p-type transistor MP11, a second p-type transistor MP12, a first n-type transistor MN11, and a second n-type transistor MN12, switches SW1 and SW2, and a current source CS. The first comparator stage 210 may include MP11, MP12, MN11, and MN12. For example, the current source CS may be implemented as an NMOS transistor, that is, an n-type metal oxide semiconductor field effect transistor (MOSFET), one end thereof may be connected to a ground voltage, and may generate a bias current 2IB.

MN11 and MN12 may receive differential inputs, for example, INP and INN, respectively, and may generate a differential current according to a level difference between INP and INN. For example, RAMP may be received as INP, and the pixel signal PXS may be received as INN.

When INP and INN are equal, an equal amount of current may flow through MN11 and MN12, and when INP and INN are different, the amount of current flowing through MN11 and MN12 may differ. A sum of the amount of current flowing through MN11 and MN12 may be equal to the bias current 2IB.

One end of MP11 may be applied with VDD, and the other end thereof may be connected to a second circuit node ON at which a signal OS1N is provided. VDD may be applied to one end of MP12, and the other end thereof may be connected to a first circuit node OP outputting OS1P. OS1P and OS1N may be determined according to current mirroring of MP11 and MP12. OS1P and OS1N may be determined based on the amount of current flowing through MN11 and MN12. When INP is higher than INN, more current may flow through MN11 than through MN12, and accordingly, a level of OS1P may increase and a level of OS1N decrease.

When the switches SW1 and SW2 are turned on, the input terminal to which INN is input may be connected to OP, and an input terminal to which INP is input may be connected to a second circuit node ON to which the second signal OS1N is provided. For example, during the auto-zero period, AZ1 for turning on the switches SW1 and SW2 may be received, and voltage levels of INP, INN, OS1P, and OS1N may be equal; in this case, the voltage level of each of INP, INN, OS1P, and OS1N may be referred to as an auto-zero voltage. On the other hand, for example, during the comparison operation period in which the first comparator stage 210 performs a comparison operation, the switches SW1 and SW2 may be turned off.

The limiter LT may include an n-type transistor TL, which may be an NMOS transistor. VDD may be applied to one end (e.g., a drain) of TL, and the other end (e.g., a source) thereof may be connected to OP. VDD may be applied to a gate of the limiter LT.

An amount of current provided by the limiter LT to OP may vary according to the voltage level of OS1P. For example, as the voltage level of OS1P is reduced to a certain level (for example, a value obtained by subtracting a threshold voltage of TL from VDD), the amount of current provided to OP by the limiter LT may increase, and the amount of current flowing through MN12 may also increase. Accordingly, the voltage level of OS1P may be prevented from decreasing below the certain level. Accordingly, the comparison circuit 141 and the image sensor according to an embodiment may sufficiently secure a drain-source voltage of MN12 to which the pixel signal PXS is input to the gate thereof as INN, and may remove the CFPN associated with the RTS.

The second comparator stage 220 may include a p-type transistor MP2 and a n-type transistor MN2, a switch SW3, and a capacitor CA. The first circuit node OP may be connected to a gate of MP2, and OS1P may be input as an input signal of the second comparator stage 220. VDD may be applied to one end of MP2, and the other end thereof may be connected to an output terminal OT at which the output signal OS2 of the second comparator stage 220 is output.

One end of MN2 may be connected to the output terminal OT, and the ground voltage may be applied to the other end thereof. In other words, MP2 may be connected in series with MN2. MN2 may operate as a current source, and may generate a bias current based on the voltage of one end of the capacitor CA.

The switch SW3 may be connected between the output terminal OT and one terminal of the capacitor CA, and may be turned on during the auto-zero period by the second auto-zero signal AZ2. On the other hand, in the operation period in which the second comparator stage 220 performs a waveform shaping operation, the switch SW3 may be turned off, and as the voltage at one end of the capacitor CA set in the auto-zero period is maintained, MN2 may generate a bias current. It is noted here that the waveform shaping operation may also be referred to as a comparison operation in which the OS1P at the gate of MP2 is compared to the voltage level at the output terminal OT.

For example, during the waveform shaping operation, the second comparator stage 220 may operate as an inverter. When the voltage level of OS1P increases, the voltage level of OS2 of the second comparator stage 220 may decrease.

Figure 4:
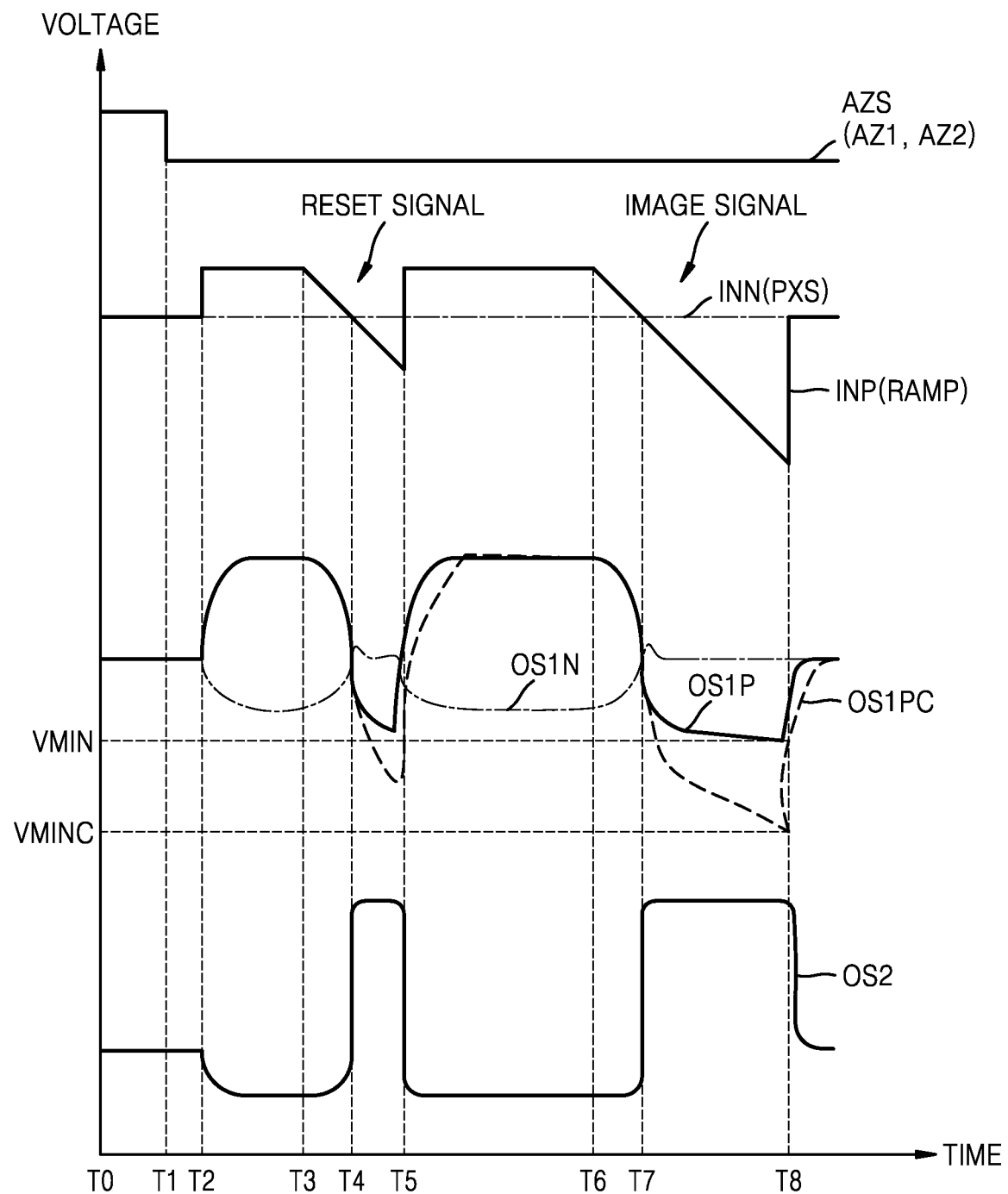
FIG. 4 is a timing diagram of signals input/output from/to the comparison circuit of FIG. 3.

FIG. 4 is a timing diagram of signals input/output to/from the comparison circuit 141 in FIG. 3, and explains the operation of the ADC 130 in FIG. 2.

Referring to FIGS. 2 through 4, a period from a time point T0 to a time point T1 may be defined as an auto-zero period, and a period from a time point T1 to a time point T8 may be defined as a comparison operation period. From T0 to T1, AZ (for example, AZ1 and AZ2) may be activated, and in response to AZ, the comparison circuit 141 may be initialized. For example, levels at the input terminals and/or output terminals of the first comparator stage 210 and the second comparator stage 220 may be equalized.

For digital conversion of the reset signal, after an offset is applied to RAMP at a time point T2, RAMP may progressively decrease (and have a negative slope) from a time point T3 to a point T5. The counter 151 may count by using the counting clock signal CLK from T3 to the time point T4 at which the logic level/polarity of the output signal OS2 of the second comparator stage 220 is changed. As illustrated in FIG. 4, a logic level transition in OS1P from a logic high to a logic low at time T4 is more gradual than the corresponding (inverted) logic level transition in the output signal OS2. This is because the second comparator stage 220 sharpens the logic level transitions in the first stage output signal OS1P. Further, the levels in OS2 following the edge transitions are flattened as compared to the first stage output signal OS1P. Thus, the waveform shape in OS2 during the time period from T4 to T5 is flatter than that of OS1P. Similarly, the waveform shape in OS2 is flatter than that of OS1P between T5 and T6, and between T7 and T8; and the logic level transition at T7 is sharper in OS2 as compared to that for OS1P. Accordingly, the second comparator stage 141 may shape OS1P to generate OS2 by sharpening an edge transition between a first logic level and a second logic level represented by OS1P at a transition time point at which a result of a subtraction of RAMP from PXS changes polarity. Further, the second comparator stage 141 may flatten a level of OS1P following the transition time point.

When the digital conversion of the reset signal is completed, an offset may be applied again to RAMP at T5 to convert the image signal into a digital signal at T5. OS1P may have a relatively high voltage compared to an auto-zero state from T2 at which INP has a higher voltage level than INN to T4, and may have a relatively low voltage from T4 at which INP has a lower voltage level than INN to T5.

On the other hand, the second output signal OS1N may have a relatively low voltage compared to the auto-zero state from T2 to T4, as opposed to OS1P, and may have a relatively high voltage from T4 up to T5. However, when the limiter LT is disabled, the second output signal OS1N may have a voltage level similar to the auto-zero state from T2 to T4, and according to an enable state and a disable state of the limiter LT, the voltage level of the second output signal OS1N may vary from as illustrated.

After T5, the transfer transistor TX may be turned on, and INN may be changed by charges that have been accumulated by the photodiode PD after T5. In FIG. 4, for clarity of explanation, a state is assumed in which INN does not change because photocharges generated by the photodiode PD are not accumulated.

For digital conversion of the image signal, RAMP may decrease from T6 to T8. OS1P may have a relatively higher voltage compared to the auto-zero state from T5 to T7 during which INP has a higher voltage level than INN. OS1P may have a relatively lower voltage compared to the auto-zero state from T7 to T8 during which INP has a lower voltage level than INN. On the other hand, the second signal OS1N, as opposed to OS1P, may have a relatively lower voltage compared to the auto-zero state from T5 to T7, and may have a relatively higher voltage from T7 to T8.

The counter 151 may count the counting clock signal CLK from T6 to T7 during which the logic level/polarity of the output signal OS2 of the second comparator stage 220 is changed. To perform the next read operation, an offset may be applied again to RAMP at T8.

In this case, because the comparison circuit 141 according to the embodiment includes the limiter LT, the range of the voltage level of OS1P may be limited by the limiter LT. The lowest value VMIN of OS1P according to the inventive concept may be higher than the lowest value VMINC of a first output signal OS1PC according to the comparative example not including the limiter LT.

When digital conversion of the image signal for a certain pixel is completed, the ADC 130 may be initialized for the correlated double sampling for the next pixel. A change of each signal illustrated in FIG. 3 is exemplary, and the timing of each signal may be changed according to an implementation method of the ADC 130, for example, structures of the first comparator stage 210 and the second comparator stage 220.

Figure 5:
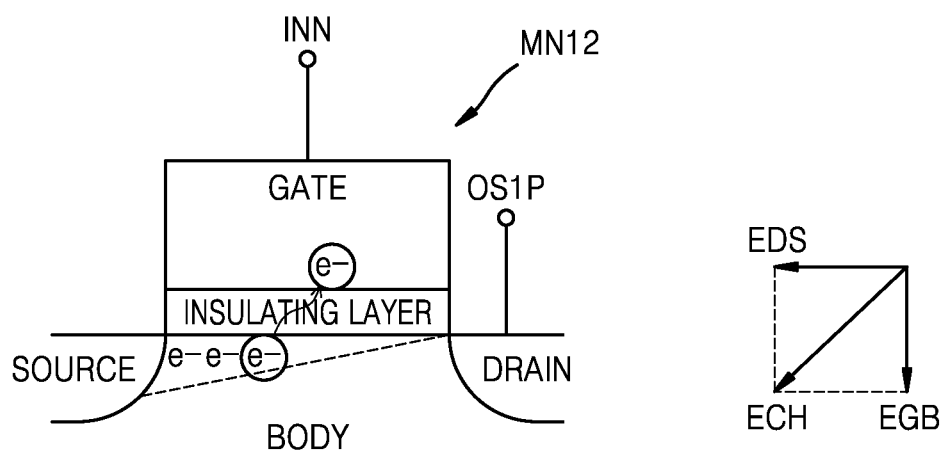
FIG. 5 is a diagram of a transistor included in the comparison circuit of the ADC, according to an embodiment.

FIG. 5 is a diagram depicting regions of a transistor included in a comparison circuit of the ADC 130 according to an embodiment, and describes an effect of the comparison circuit and an image sensor according to the inventive concept. MN12 illustrated in FIG. 5 may be MN12 in FIG. 3 which receives INN.

Referring to FIGS. 3 and 5, INN may be input to a gate of MN12, and OS1P may be output to a drain of MN12.

When the voltage level of OS1P becomes excessively low, while an electric field EGB between a gate and a body of MN12 is maintained, a magnitude of an electric field EDS between a drain and a source of MN12 may be reduced. Accordingly, an influence of the electric field EGB between the gate and the body on an electric field in a channel (ECH) of MN12 may relatively increase, and carriers (for example, electrons) in the channel may be subject to force in a vertical direction, that is, a gate direction. Accordingly, electrons of the channel of MN12 may be trapped in an insulating layer, or may pass through the insulating layer and be trapped on a lower surface of the gate. In other words, the electrons in the channel of MN12 may move and be trapped under the gate.

When electrons trapped on the lower surface of the gate of MN12 during the comparison operation are not de-trapped until the next comparison operation of the first comparator stage 210, this phenomenon may affect subsequent comparison operations. In particular, when the electrons are trapped or de-trapped on the lower surface of the gate of MN12 during the comparison operation, column-fixed pattern noise associated with a random telegraph signal may occur.

An image sensor according to the inventive concept may limit a lower limit of the voltage level of OS1P, by including the limiter LT connected to OP of the first comparator stage 210. Accordingly, trapping of electrons at the gate of MN12 connected to OP may be prevented, and generation of noise may be prevented.

Figure 6A:
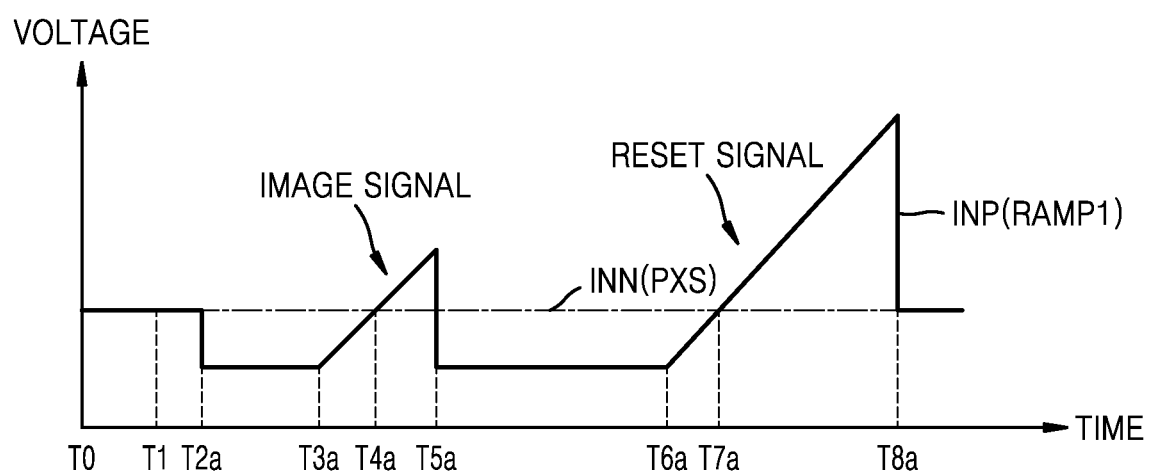
FIGS. 6A and 6B are timing diagrams of signals input to the comparison circuit of the ADC, according to respective embodiments.
Figure 6B:
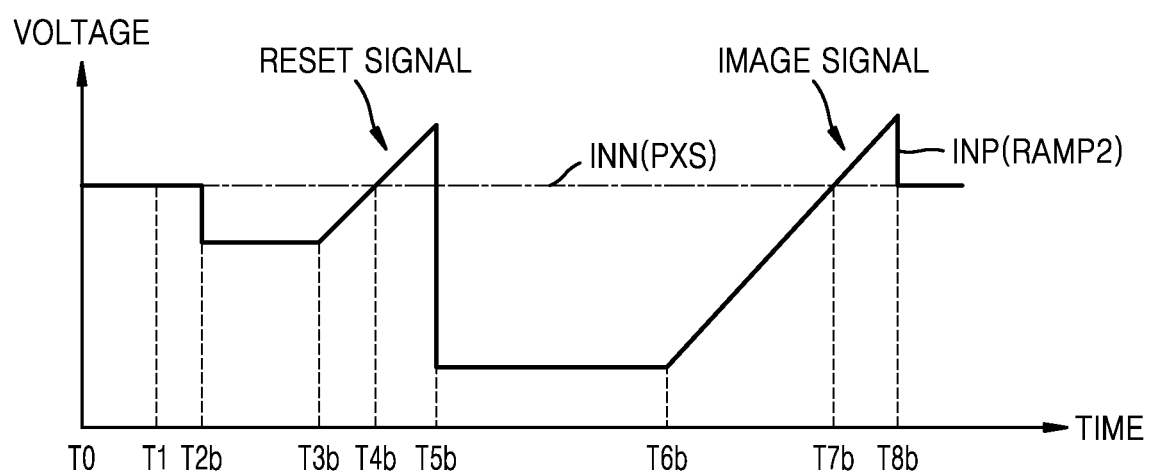

FIGS. 6A and 6B are timing diagrams of signals input to comparison circuits of the ADC 130, according to an embodiment. FIGS. 6A and 6B depict examples of the ramp signal RAMP in FIG. 1, and illustrate the operation of the first comparator stage 210 when the first ramp signal RAMP1 and the second ramp signal RAMP2, which are reverse ramp signals, are received. In the description with reference to FIGS. 6A and 6B, duplicate descriptions of the same reference numerals as in FIG. 3 are omitted.

Referring to FIGS. 2 and 6A, after an offset is applied to the first ramp signal RAMP1 at a time point T2a for digital conversion of an image signal, the first ramp signal RAMP1 may increase (RAMP1 may have a positive slope) from a time point T3a to a time point T5a. The counter 151 may count by using the counting clock signal CLK from T3a to a time point T4a (zero-crossing time point) at which a voltage level of the first ramp signal RAMP1 and the voltage level of the pixel signal PXS are the same as each other.

From T3a to T4a, the voltage level of the pixel signal PXS may be higher than the voltage level of the first ramp signal RAMP1, and the current generated by the limiter LT may be provided to MN12. The amount of current flowing through MN12 from T3a to T4a may be greater than the amount of current flowing through MN12 at T4a of the zero-crossing (for example, IB). Accordingly, transconductance (gm) of MN12 may increase. In addition, because the current generated by the limiter LT flows to MN12 via OP, a size of output resistance at OP may be reduced.

A bandwidth of the first comparator stage 210 implemented as an amplifier may be proportional to transconductance, and be inversely proportional to output resistance. Accordingly, the bandwidth of the first comparator stage 210 according to the inventive concept may increase. Whereas a comparator according to a comparative example embodiment in which the limiter LT is not connected to the first circuit node needs to increase the bias current 2IB of the power source, the first comparator stage 210 of the comparison circuit 141 according to the embodiment may secure a bandwidth even when the bias current 2IB of the current source CS is reduced, and accordingly, power consumption of the first comparator stage 210 may be reduced.

After the digital conversion of the image signal is completed, an offset may be applied again to the first ramp signal RAMP1 from T5a to a time point T6a. To convert the reset signal into a digital signal, the first ramp signal RAMP1 may increase from T6a to a time point T8a. The counter 151 may count by using the counting clock signal CLK from T6a to a time point T7a at which the voltage level of the first ramp signal RAMP1 and the voltage level of the pixel signal PXS are the same. Even between T6a and T7a during which the reset signal is converted into the digital signal, the first comparator stage 210 of the image sensor 100 according to the embodiment may maintain the bandwidth even when the size of the bias current 2IB of the current source CS is reduced, and accordingly, power consumption of the first comparator stage 210 may be reduced.

Referring to FIGS. 2 and 6B, after a first offset is applied to the second ramp signal RAMP2 at a time point T2b for digital conversion of the reset signal, a second ramp signal RAMP2 may increase from a time point T3b to a time point T5b. The counter 151 may count by using the counting clock signal CLK from T3b to a time point T4b (zero-crossing time point) at which a voltage level of the second ramp signal RAMP2 and the voltage level of the pixel signal PXS are the same. Even between T3b and T4b during which the reset signal is converted into the digital signal, the first comparator stage 210 of the image sensor 100 according to the embodiment may maintain the bandwidth even when the size of the bias current 2IB of the current source CS is reduced, and accordingly, power consumption of the first comparator stage 210 may be reduced.

When the digital conversion of the reset signal is completed, a second offset may be applied to the second ramp signal RAMP2 from T5b to a time point T6b. In this case, the voltage level of the second ramp signal RAMP2 at T5b at which a second offset is applied may be lower than the voltage level of the second ramp signal RAMP2 at T2b at which the first offset is applied.

To convert the image signal into a digital signal, the second ramp signal RAMP2 may increase from T6b to a time point T8b. The counter 151 may count by using the counting clock signal CLK from T6b to a time point T7b at which the voltage level of the second ramp signal RAMP2 and the voltage level of the pixel signal PXS are the same. Even between T6b and T7b during which the image signal is converted into the digital signal, the first comparator stage 210 of the image sensor 100 according to the embodiment may maintain the bandwidth even when the size of the bias current 2IB of the current source CS is reduced, and accordingly, power consumption of the first comparator stage 210 may be reduced.

Figure 7:
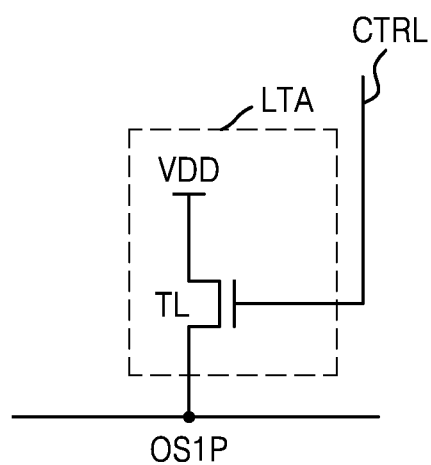
FIGS. 7, 8 and 9 are circuit diagrams of example limiting circuits included in a comparison circuit of the ADC, according to embodiments.
Figure 8:
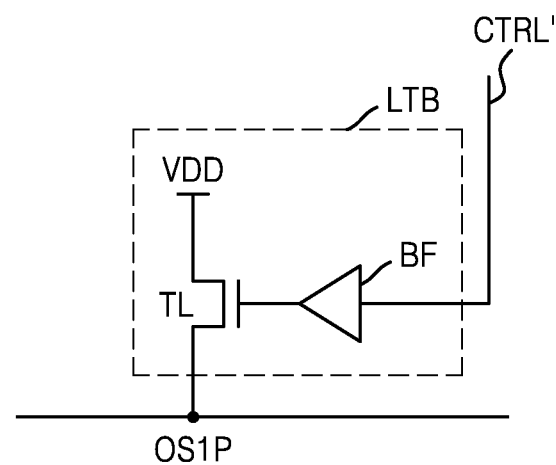
Figure 9:
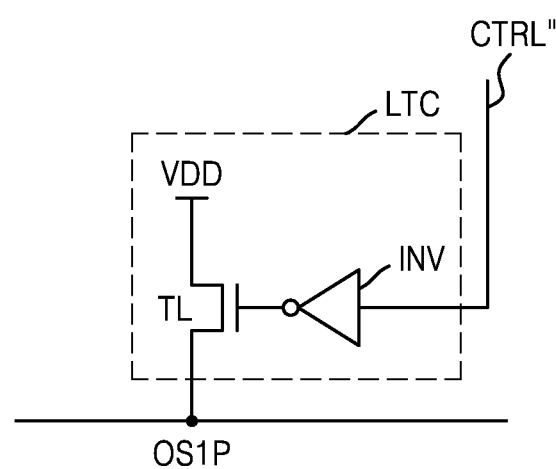

FIGS. 7 through 9 are circuit diagrams of limiting circuits included in a comparison circuit of the ADC 130, according to embodiments.

Referring to FIGS. 2 and 7, a limiter LTA may include an n-type transistor TL. VDD may be applied to one end (for example, a drain) of TL, and the other end (for example, a source) thereof may be connected to the first circuit node OP of the first comparator stage 210.

A current control signal CTRL may be input to a gate of the limiter LTA. For example, the current control signal CTRL may be provided by the timing generator (170 in FIG. 1). The timing generator 170 may provide the current control signal CTRL having high level to the limiter LTA while the ADC 130 connected to a particular column line COL is operating. In this case, a voltage level of the current control signal CTRL may be the same as VDD. On the other hand, the timing generator 170 may provide the current control signal CTRL having low level (for example, a ground voltage) to the limiter LTA while the ADC 130 connected to the particular column line COL is not operating, and TL may be turned off. However, the limiter LTA according to the embodiment is not limited thereto, and the timing generator 170 may continuously provide the current control signal CTRL having high level to the limiter LTA while the image sensor (100 in FIG. 1) is operating.

Referring to FIGS. 2 and 8, a limiter LTB may include TL, and may include a buffer BF. VDD may be applied to one end of TL, and the other end thereof may be connected to OP of the first comparator 210.

The buffer BF may be connected to a gate of the limiter LTB, and a current control signal CTRL' may be input to the buffer BF. The buffer BF may provide VDD to a gate of TL according to the current control signal CTRL'.

For example, the current control signal CTRL' may be provided by the timing generator (170 in FIG. 1). The timing generator 170 may provide the current control signal CTRL' having high level to the buffer BF of the limiter LTB while the ADC 130 connected to the particular column line COL is operating, and the buffer BF may provide VDD to the gate of TL. On the other hand, the timing generator 170 may provide the current control signal CTRL' having low level to the buffer BF while the ADC 130 connected to the particular column line COL is not operating. However, the limiter LTB according to the embodiment is not limited thereto, and the timing generator 170 may provide the current control signal CTRL' having high level to the limiter LTB while the image sensor (100 in FIG. 1) is operating.

Referring to FIGS. 2 and 9, a limiter LTC may include TL, and may include an inverter INV. VDD may be applied to one end of TL, and the other end thereof may be connected to OP.

The inverter INV may be connected to a gate of the limiter LTC, and a current control signal CTRL" may be input to the inverter INV. The inverter INV may provide VDD to the gate of TL according to the current control signal CTRL".

For example, the current control signal CTRL" may be provided by the timing generator (170 in FIG. 1). The timing generator 170 may provide the current control signal CTRL" having low level to the inverter INV of the limiter LTC while the ADC 130 connected to the particular column line COL is operating, and the inverter INV may provide VDD to the gate of TL. On the other hand, the timing generator 170 may provide the current control signal CTRL" having high level to the inverter INV while the ADC 130 connected to the particular column line COL is not operating. However, the limiter LTC according to the embodiment is not limited thereto, and the timing generator 170 may provide the current control signal CTRL" having high level to the limiter LTC while the image sensor (100 in FIG. 1) is operating.

Figure 10:
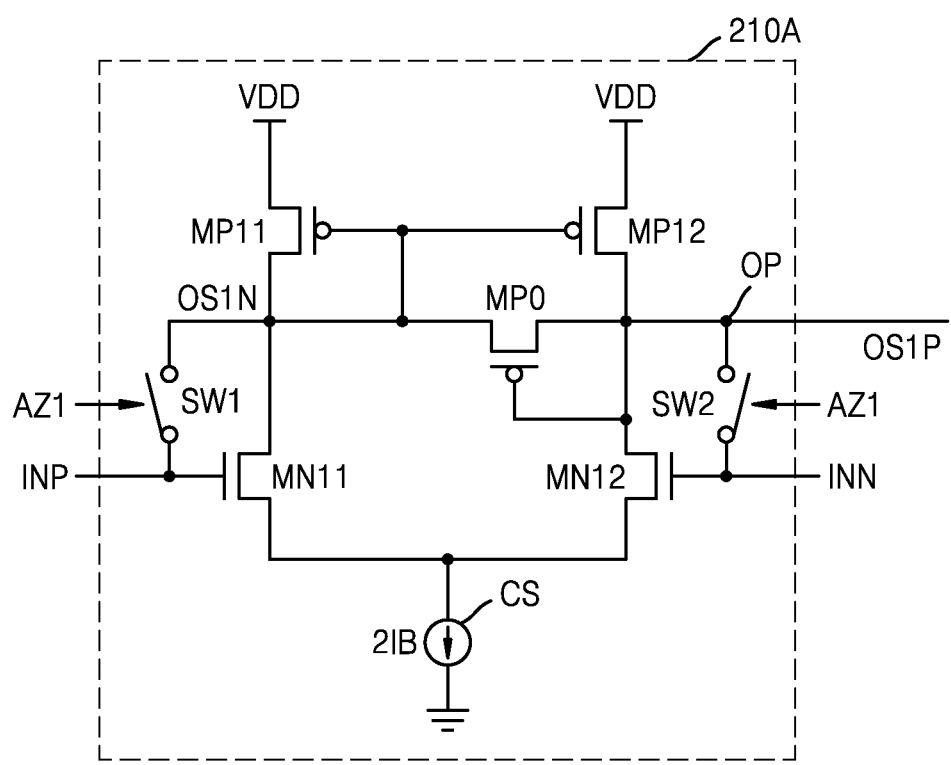
FIGS. 10 and 11 are circuit diagrams of first comparator stages included in the comparison circuit of the ADC, according to embodiments.
Figure 11:
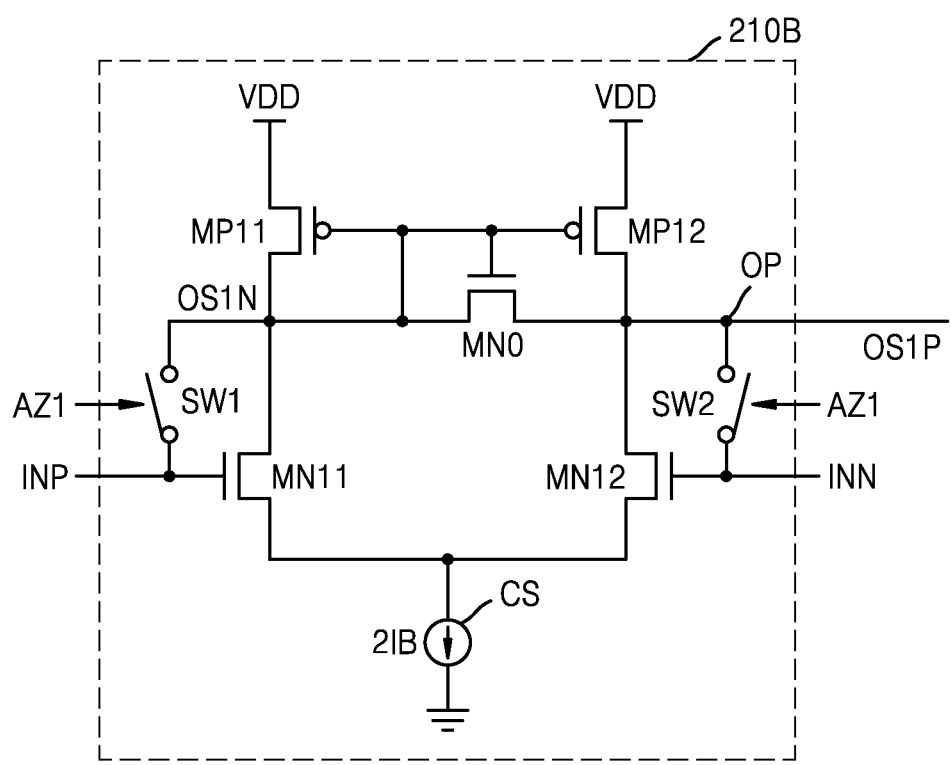

FIGS. 10 and 11 are circuit diagrams of first comparators included in the comparison circuit of the ADC 130, according to embodiments. In the description with reference to FIGS. 10 and 11, duplicate descriptions of the same reference numerals as in FIG. 3 are omitted.

Referring to FIG. 10, a first comparator stage 210A may include MP11, MP12, MN11, MN12, the switches SW1 and SW2, and the current source CS. The first comparator stage 210A may include MP11, MP12, MN11, MN12, and a third p-type transistor MP0.

The third P-type transistor MP0 may be connected between OP for outputting OS1P and a second output terminal for outputting the second output signal OS1N. A gate of the third P-type transistor MP0 may be connected to OP, and the third P-type transistor MP0 may operate as a diode. A swing width of OS1P may be limited by the third P-type transistor MP0.

Referring to FIG. 11, a first comparator stage 210B may include MP11, MP12, MN11, MN12, the switches SW1 and SW2, and the current source CS. The first comparator stage 210B may include MP11, MP12, MN11, MN12, and a third n-type transistor MN0.

The third n-type transistor MN0 may be connected between OP for outputting OS1P and the second output terminal for outputting the second output signal OS1N. A gate of the third N-type transistor MN0 may be connected to the gate of MP11, the gate of MP12, and the second output terminal outputting the second output signal OS1N, and the third N-type transistor MN0 may operate as a diode. The swing width of OS1P may be limited by the third n-type transistor MN0.

In FIGS. 10 and 11, examples of diodes connected between the node OP for outputting OS1P and the second output terminal for outputting the second output signal OS1N are illustrated, and the comparison circuit (141 in FIG. 2) according to an embodiment is not limited to the configurations of FIGS. 10 and 11. For example, the comparison circuit 141 according to the embodiment may include at least one of the third p-type transistor MP0 and the third n-type transistor MN0, or may include various configurations limiting the swing width of OS1P.

The voltage level of OS1P may be prevented from decreasing below the particular level by the third p-type transistor MP0 or the third n-type transistor MN0. Accordingly, an image sensor according to the embodiment may sufficiently secure the drain-source voltage of MN12, and may remove the CFPN associated with the RTS.

In an example embodiment, at least one of the limiter LT in FIG. 3, the limiter LTA in FIG. 7, the limiter LTB in FIG. 8, and the limiter LTC in FIG. 9 may be connected to OP of the first comparator stage 210A in FIG. 10. In addition, in an example embodiment, at least one of the limiter LT in FIG. 3, the limiter LTA in FIG. 7, the limiter LTB in FIG. 8, and the limiter LTC in FIG. 9 may be connected to the first circuit node OP of the first comparator stage 210B in FIG. 11.

Figure 12:
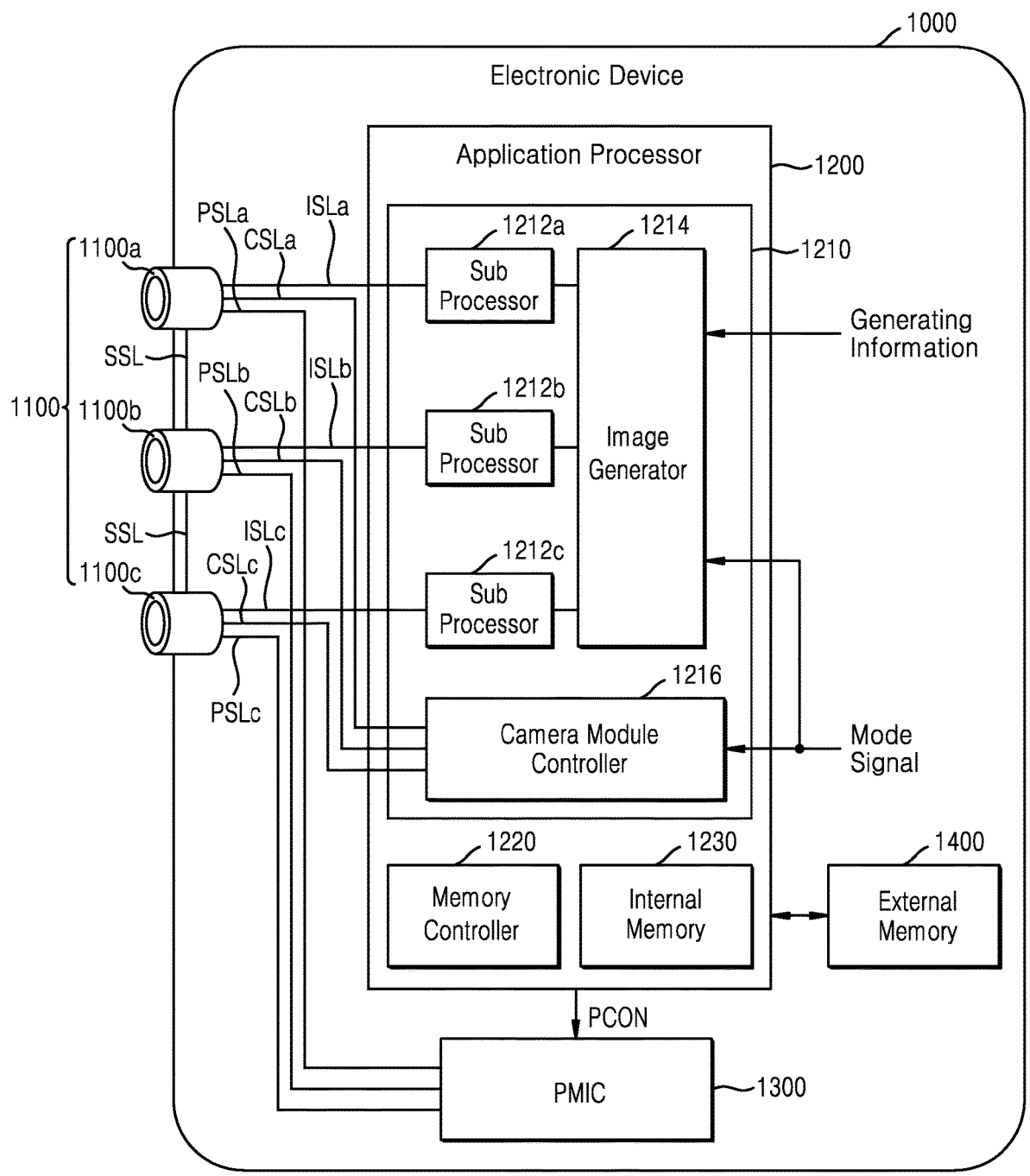
FIG. 12 is a diagram of an electronic device including a multi-camera module.
Figure 13:
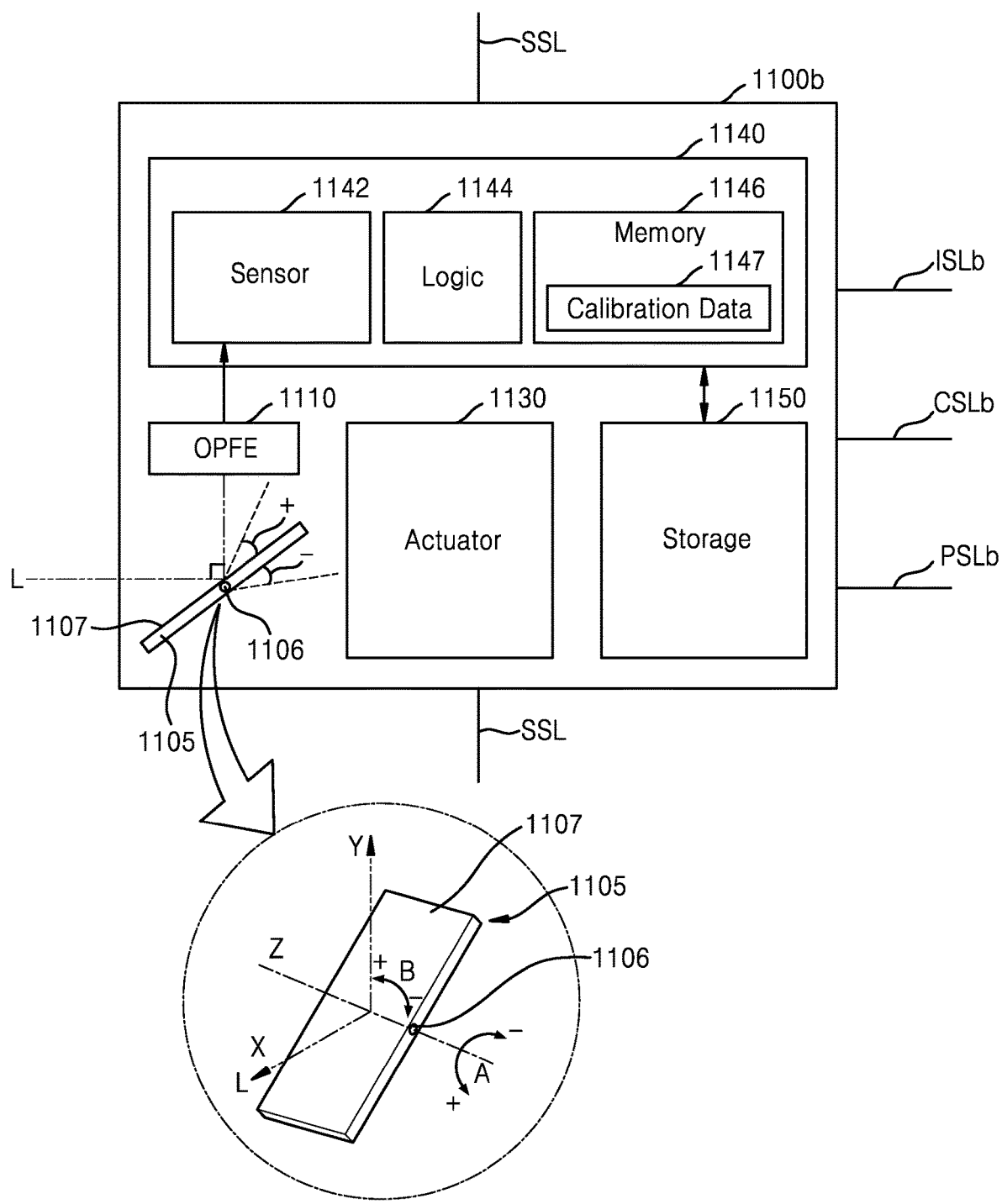
FIG. 13 is a diagram of an example multi-camera module in FIG. 12.

FIG. 12 is a diagram of an electronic device including a multi-camera module. FIG. 13 is a detailed diagram of the multi-camera module in FIG. 12. FIG. 13 illustrates a detailed configuration of a camera module 1100b, but the following description may be equally applied to other camera modules 1100a and 1100c according to an embodiment.

Referring to FIG. 12, an electronic device 1000 may include a camera module group 1100, an application processor 1200, a power management integrated circuit (PMIC) 1300, and an external memory 1400. The camera module group 1100 may include a plurality of camera modules 1100a, 1100b, and 1100c. Although the drawing illustrates an embodiment in which three camera modules 1100a, 1100b, and 1100c are arranged, embodiments are not limited thereto.

Referring to FIGS. 12 and 13, the camera module 1100b may include a prism 1105, an optical path folding element (OPFE) 1110, an actuator 1130, and an image sensing device 1140, and a storage 1150.

The prism 1105 may change a path of light L incident from the outside by including a reflective surface 1107 of a light reflecting material. The OPFE 1110 may include, for example, an optical lens including m (where m is a natural number) groups. The actuator 1130 may move the OPFE 1110 or an optical lens to a particular position.

The image sensing device 1140 may include an image sensor 1142, a control logic 1144, and a memory 1146. The image sensor 1142 may sense an image of a sensing target by using the light L provided through the optical lens. The image sensor 1142 may include the image sensor 100 described with reference to FIG. 1, and may include the comparison circuit 141 described with reference to FIGS. 2 and 3.

The control logic 1144 may control all operations of the camera module 1100b. For example, the control logic 1144 may control an operation of the camera module 1100b according to a control signal provided via a control signal line CSLb.

In an example embodiment, one camera module (for example, 1100b) of the plurality of camera modules 1100a, 1100b, and 1100c may include a folded lens-type camera module including the prism 1105 and the OPFE 1110 described above, and the remaining camera modules (for example, 1100a and 1100b) may include a vertical-type camera module that does not include the prism 1105 and the OPFE 1110, but embodiments are not limited thereto.

In an example embodiment, one camera module (for example, 1100c) of the plurality of camera modules 1100a, 1100b, and 1100c may include the vertical-type depth camera that extracts depth information by using, for example, infrared ray (IR). In this case, the application processor 1200 may generate a three-dimensional (3D) depth image by merging an image data value provided by the depth camera with an image data value provided by another camera module (for example, 1100a or 1100b).

In an example embodiment, at least two camera modules (for example, 1100a and 1100b) of the plurality of camera modules 1100a, 1100b, and 1100c may have different field of views from each other. In this case, for example, at least two camera modules (for example, 1100a and 1100b) of the plurality of camera modules 1100a, 1100b, and 1100c may be different from each other, but the embodiment is not limited thereto.

In addition, in an example embodiment, the field of view of each of the plurality of camera modules 1100a, 1100b, and 1100c may be different from each other. In this case, optical lenses included in each of the plurality of camera modules 1100a, 1100b, and 1100c may also be different from each other, but the embodiment is not limited thereto.

In an example embodiment, each of the plurality of camera modules 1100a, 1100b, and 1100c may be physically apart from each other. In other words, the sensing area of one image sensor 1142 may not be divided and used by the plurality of camera modules 1100a, 1100b, and 1100c, but an independent image sensor 1142 may be arranged inside each of the plurality of camera modules 1100a, 1100b, and 1100c.

Referring again to FIG. 12, the application processor 1200 may include an image processing device 1210, a memory controller 1220, and an internal memory 1230. The application processor 1200 may be implemented separately from the plurality of camera modules 1100a, 1100b, and 1100c. For example, the application processor 1200 and the plurality of camera modules 1100a, 1100b, and 1100c may be implemented separated from each other as separate semiconductor chips.

The image processing device 1210 may include a plurality of sub-image processors 1212a, 1212b, and 1212c, an image generator 1214, and a camera module controller 1216.

The image processing device 1210 may include the plurality of sub-image processors 1212a, 1212b, and 1212c corresponding to the number of camera modules 1100a, 1100b, and 1100c.

Image data values generated by each of the camera modules 1100a, 1100b, and 1100c may be provided to the corresponding sub-image processors 1212a, 1212b, and 1212c via the separate image signal lines ISLa, ISLb, and ISLc. For example, the image data value generated by the camera module 1100a may be provided to the sub-image processor 1212a via the image signal line ISLa, the image data value generated by the camera module 1100b may be provided to the sub-image processor 1212b via the image signal line ISLb, and the image data value generated by the camera module 1100c may be provided to the sub-image processor 1212c via the image signal line ISLc. The transmission of the image data value may be performed by using, for example, a camera serial interface (CSI) based on a mobile industry processor interface (MIPI), but embodiments are not limited thereto.

Image data values provided to each of the sub-image processors 1212a, 1212b, and 1212c may be provided to the image generator 1214. The image generator 1214 may generate an output image by using image data provided by each of the sub-image processors 1212a, 1212b, and 1212c according to image generation information or a mode signal.

The image generator 1214 may generate an output image by merging at least some of the image data values generated by the camera modules 1100a, 1100b, and 1100c having different field of views from each other according to image generation information or a mode signal. In addition, the image generator 1214 may generate an output image by selecting at least one of the image data values generated by the camera modules 1100a, 1100b, and 1100c having different field of views from each other according to image generation information or a mode signal.

The camera module controller 1216 may provide a control signal to each of the camera modules 1100a, 1100b, and 1100c. The control signal generated by the camera module controller 1216 may be provided to the corresponding camera modules 1100a, 1100b, and 1100c via control signal lines CSLa, CSLb, and CSLc, which are separated from each other.

The application processor 1200 may store the received image data values, that is, encoded data, in the memory 1230 provided therein or an external storage 1400 external to the application processor 1200, and then, may decode the encoded data read from the memory 1230 or the external storage 1400, and may display an image generated based on the decoded image data value. For example, a corresponding sub-processor corresponding to the plurality of sub-processors 1212a, 1212b, and 1212c of the image processing device 1210 may perform decoding, and may also perform image processing on the decoded image data value.

The PMIC 1300 may provide power, for example, a power voltage to each of the plurality of camera modules 1100a, 1100b, and 1100c. For example, the PMIC 1300 may provide first power to the camera module 1100a via a power signal line PSLa under the control of the application processor 1200, provide second power to the camera module 1100b via a power signal line PSLb, and provide third power to the camera module 1100c via a power signal line PSLc.

While the inventive concept has been particularly shown and described with reference to embodiments thereof, it will be understood that various changes in form and details may be made therein without departing from the spirit and scope of the following claims. For example, in other embodiments, any of the above-described A/D converters is configured to convert another type of analog signal (other than a pixel signal) to a digital signal. In such embodiments, the pixel signal PXN is substituted with a different type of analog signal, and the comparison circuit 141 may generate the output signal OS2 in an analogous manner.

What is claimed is:

1. An image sensor comprising:
    a pixel array comprising a plurality of pixels;
    a ramp signal generator configured to generate a ramp signal; and
    a comparison circuit configured to output a comparison result signal by comparing a pixel signal output by the pixel array with the ramp signal,
    wherein the comparison circuit comprises:
    a first comparator stage configured to output a first stage output signal according to a result of comparing the pixel signal with the ramp signal, to a first circuit node;
    a limiter comprising an n-type transistor having one end connected to the first circuit node and an opposite end to which a power supply voltage is applied; and
    a second comparator stage configured to generate the comparison result signal by shaping the first stage output signal,
    wherein the limiter is configured to prevent reduction of the first stage output signal below a particular voltage independent of the comparison result signal.

2. The image sensor of claim 1, wherein the power supply voltage is applied directly from a power supply terminal to a gate of the n-type transistor.

3. The image sensor of claim 1, further comprising a timing generator configured to control operations of the ramp signal generator and the comparison circuit,
    wherein the n-type transistor provides current to the first circuit node in response to a current control signal provided by the timing generator.

4. The image sensor of claim 1, wherein the limiter further comprises a buffer connected to a gate of the n-type transistor.

5. The image sensor of claim 4, further comprising a timing generator controlling operations of the ramp signal generator and the comparison circuit,
    wherein the buffer provides a power supply voltage to the gate of the n-type transistor in response to a current control signal having high level provided by the timing generator.

6. The image sensor of claim 1, wherein the limiter further comprises an inverter connected to a gate of the n-type transistor.

7. The image sensor of claim 6, further comprising a timing generator controlling operations of the ramp signal generator and the comparison circuit,
    wherein the inverter provides a power supply voltage to the gate of the n-type transistor in response to a current control signal having low level provided by the timing generator.

8. The image sensor of claim 1, wherein the first comparator stage outputs a second signal to a second circuit node, and
    the first comparator stage further comprises a p-type transistor connected between the first circuit node and the second circuit node.

9. The image sensor of claim 1, wherein the first comparator stage outputs a second output signal to a second circuit node, and the first comparator stage further comprises an n-type transistor connected between the first circuit node and the second circuit node.

10. The image sensor of claim 1, wherein the ramp signal generator generates the ramp signal, and the ramp signal gradually increases during an operation period in which the comparison circuit compares the pixel signal to the ramp signal.

11. The image sensor of claim 10, wherein the pixel signal comprises a reset signal output by a pixel of the plurality of pixels during a reset operation, and an image signal output before the reset signal, wherein the pixel signal is generated by the pixel by performing a photo-sensing operation, and
the comparison circuit compares the reset signal with the ramp signal, after comparing the image signal with the ramp signal.

12. The image sensor of claim 10, wherein the pixel signal comprises a reset signal output by a pixel of the plurality of pixels during a reset operation, and an image signal output after the reset signal, wherein the pixel signal is generated by the plurality of pixels by performing a photo-sensing operation, and
the comparison circuit compares the image signal with the ramp signal, after comparing the reset signal with the ramp signal.

13. An analog-to-digital (A/D) converter configured to convert a pixel signal output by a pixel array to a digital signal, the A/D converter comprising:
a first comparator stage configured to output, to a first circuit node, a first stage output signal according to a result of comparing the pixel signal with a ramp signal;
a limiter configured to limit a voltage level of the first stage output signal by providing current to the first circuit node; and
a second comparator stage configured to generate a comparison result signal by shaping the first stage output signal,
wherein the limiter comprises an n-type transistor having one end connected to the first circuit node and an opposite end to which a power supply voltage is applied, the limiter being configured to prevent reduction of the first stage output signal below a particular voltage independent of the comparison result signal.

14. The A/D converter of claim 13, wherein the power supply voltage is also applied directly from a power supply terminal to a gate of the n-type transistor.

15. The A/D converter of claim 13, wherein the limiter further comprises a buffer connected to a gate of the n-type transistor.

16. The A/D converter of claim 13, wherein the limiter further comprises an inverter connected to a gate of the n-type transistor.

17. The A/D converter of claim 13, wherein the first comparator stage outputs a second signal to a second circuit node, and
the first comparator stage comprises a p-type transistor connected between the first circuit node and the second circuit node, and a gate thereof is connected to the first circuit node.

18. The A/D converter of claim 13, wherein the first comparator stage outputs a second signal to a second circuit node, and
the first comparator stage comprises an n-type transistor connected between the first circuit node and the second circuit node, and a gate thereof connected to the second circuit node.

19. The A/D converter of claim 13, wherein the ramp signal has a positive slope during a certain period.

20. The A/D converter of claim 15, further comprising:
a counter configured to generate the digital signal by determining a count at a logic level transition time of the comparison result signal using a counting clock signal.

* * * * *